(12) United States Patent
Nagasawa

(10) Patent No.: US 7,930,582 B2
(45) Date of Patent: Apr. 19, 2011

(54) IMAGE PROCESSING APPARATUS AND METHOD OF TRANSMITTING REFERENCE CLOCK

(75) Inventor: Yuuichi Nagasawa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 695 days.

(21) Appl. No.: 11/936,451

(22) Filed: Nov. 7, 2007

(65) Prior Publication Data

US 2008/0120453 A1  May 22, 2008

(30) Foreign Application Priority Data

Nov. 22, 2006 (JP) ................................. 2006-316042
Sep. 13, 2007 (JP) ................................. 2007-237748

(51) Int. Cl.
  *G06F 1/00* (2006.01)
  *G06F 11/00* (2006.01)
(52) U.S. Cl. ........... 713/601; 713/300; 713/340; 714/22
(58) Field of Classification Search .................. 713/300, 713/340, 601; 710/58; 714/22
  See application file for complete search history.

(56) References Cited

U.S. PATENT DOCUMENTS

| 5,365,221 | A | * | 11/1994 | Fennell et al. | ........... 340/636.15 |
| 5,721,887 | A | * | 2/1998 | Nakajima | ...................... 713/500 |
| 7,590,908 | B2 | * | 9/2009 | Ishimura et al. | ............... 714/726 |
| 2005/0076259 | A1 | * | 4/2005 | Fischer et al. | ................ 713/600 |
| 2007/0030047 | A1 | * | 2/2007 | Akasaka | ........................ 327/291 |

FOREIGN PATENT DOCUMENTS

| JP | 2005-151448 | 6/2005 |
| JP | 2005-321921 | 11/2005 |

* cited by examiner

*Primary Examiner* — Mark Connolly
(74) *Attorney, Agent, or Firm* — Oblon, Spivak, McCelland, Maier & Neustadt, L.L.P.

(57) ABSTRACT

An engine unit and a control unit are connected via an interface. A power source supplies electric power to the interface. The engine unit is controlled based on a reference clock generated in the control unit and transmitted to the engine unit via the interface. Only when a voltage output from the power source to the interface is in the operating-voltage range, the clock generator sends the reference clock to the engine unit via the interface.

11 Claims, 8 Drawing Sheets

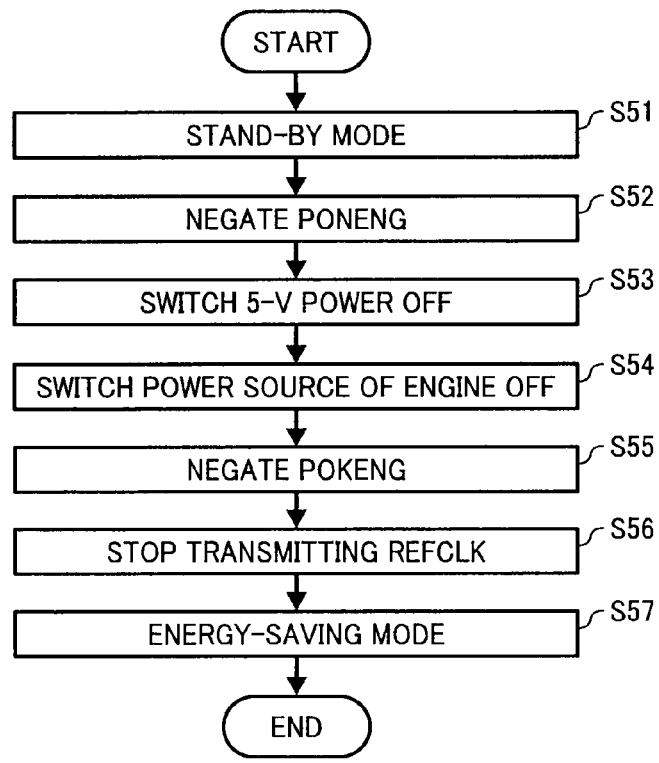
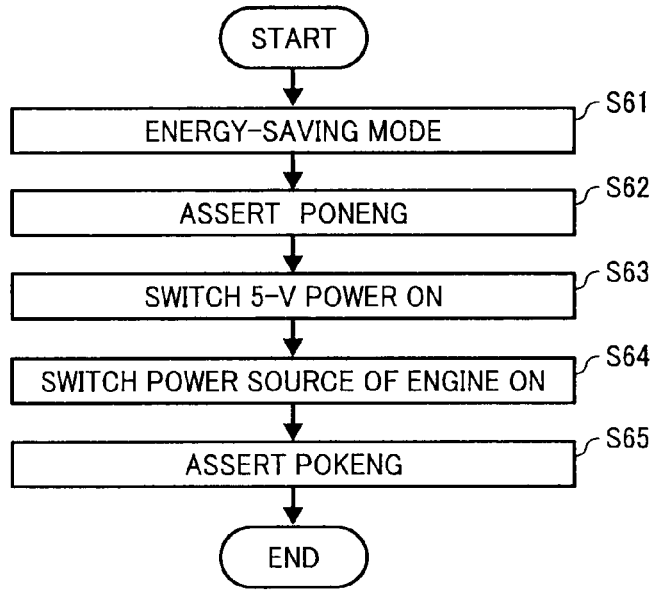

IMAGE PROCESSING APPARATUS AND METHOD OF TRANSMITTING REFERENCE CLOCK

CROSS-REFERENCE TO RELATED APPLICATIONS

The present application claims priority to and incorporates by reference the entire contents of Japanese priority documents, 2006-316042 filed in Japan on Nov. 22, 2006 and 2007-237748 filed in Japan on Sep. 13, 2007.

BACKGROUND OF THE INVENTION

1. Field of the Invention

The present invention relates to an image processing apparatus. More particularly, the present invention relates to an image processing apparatus including a high-speed serial bus and a method of transmitting a reference clock via the high-speed serial bus.

2. Description of the Related Art

Peripheral component interconnect express (registered trademark) (hereinafter, "PCI Express") is a type of high-speed serial buses. A high-speed bus is an interface capable of transmitting and receiving data at a high speed (about 100 Mbps or higher) through a single transmission path by use of serial transmission technique. The PCI Express, a successive version of PCI standards, is a standard expansion bus generally used in computers. The PCI Express is featured by transmission by using low-voltage differential signals, point-to-point full-duplex communication lines (capable of simultaneous transmit and receive), packetized split transaction, and improved scalability capable of establishing communication between different link structures.

Given below are examples of conventional technologies that relate to the PCI Express. Japanese Patent Application Laid-Open No. 2005-321921 discloses a serial-data transmitter, an image outputting device, an image inputting device, and an image processing apparatus that implement a low-cost and low-power consumption interface in an image device that can perform a high-speed serial data communication specifically based on PCI Express standards. Japanese Patent Application Laid-Open No. 2005-151448 discloses a data-transmission system, an image forming system, and a data-transmission program that provide improved data-transfer efficiency by avoiding transfer-path competition that can happen in parallel processing of a plurality of independent data transfers.

In the above-described conventional devices that includes the interface based on the PCI Express standards, when a spread-spectrum reference clock is input in a state that a voltage output from a power source of a device that receives the reference clock to the PCI Express input/output (I/O) interface is lower than a predetermined operating-voltage, the receiver device may go out of order.

SUMMARY OF THE INVENTION

It is an object of the present invention to at least partially solve the problems in the conventional technology.

According to an aspect of the present invention, there is provided an image processing apparatus including an engine unit that processes an image; a control unit that controls operation of the engine unit; an interface that connects the engine unit and the control unit to each other, wherein the control unit controls operation of the engine unit by sending a reference clock to the engine unit via the interface; and a power source that supplies electric power to the interface. The engine unit includes a first determining unit that determines whether a voltage output from the power source to the interface is in a predetermined operating-voltage range, and the control unit includes a clock generator that starts generating, when the first determining unit determines that the voltage is in the operating-voltage range, a first reference-clock and transmits the first reference-clock to the engine unit via the interface.

According to another aspect of the present invention, there is provided a method of transmitting a reference clock from a first device to a second device via an interface. The method includes determining whether a voltage input to the interface is in a predetermined operating-voltage range; and starting generating, when it is determined at the determining that the voltage is in the operating-voltage range, a reference clock by the first device and transmitting the reference clock to the second device via the interface.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 7 is a flowchart of a process of shifting to an energy-saving mode performed according to a seventh embodiment of the present invention; and FIG. 8 is a flowchart of a process of rebooting from the energy-saving mode performed according to the seventh embodiment.

DETAILED DESCRIPTION OF THE PREFERRED EMBODIMENTS

Exemplary embodiments of the present invention are described in detail below with reference to the accompanying drawings.

As explained in the following embodiments, an image processing apparatus starts transmitting a reference clock after verifying that a voltage output from a power source of a device, which receives the reference clock, to a PCI Express I/O interface is in a predetermined operating-voltage range.

Figure 1:
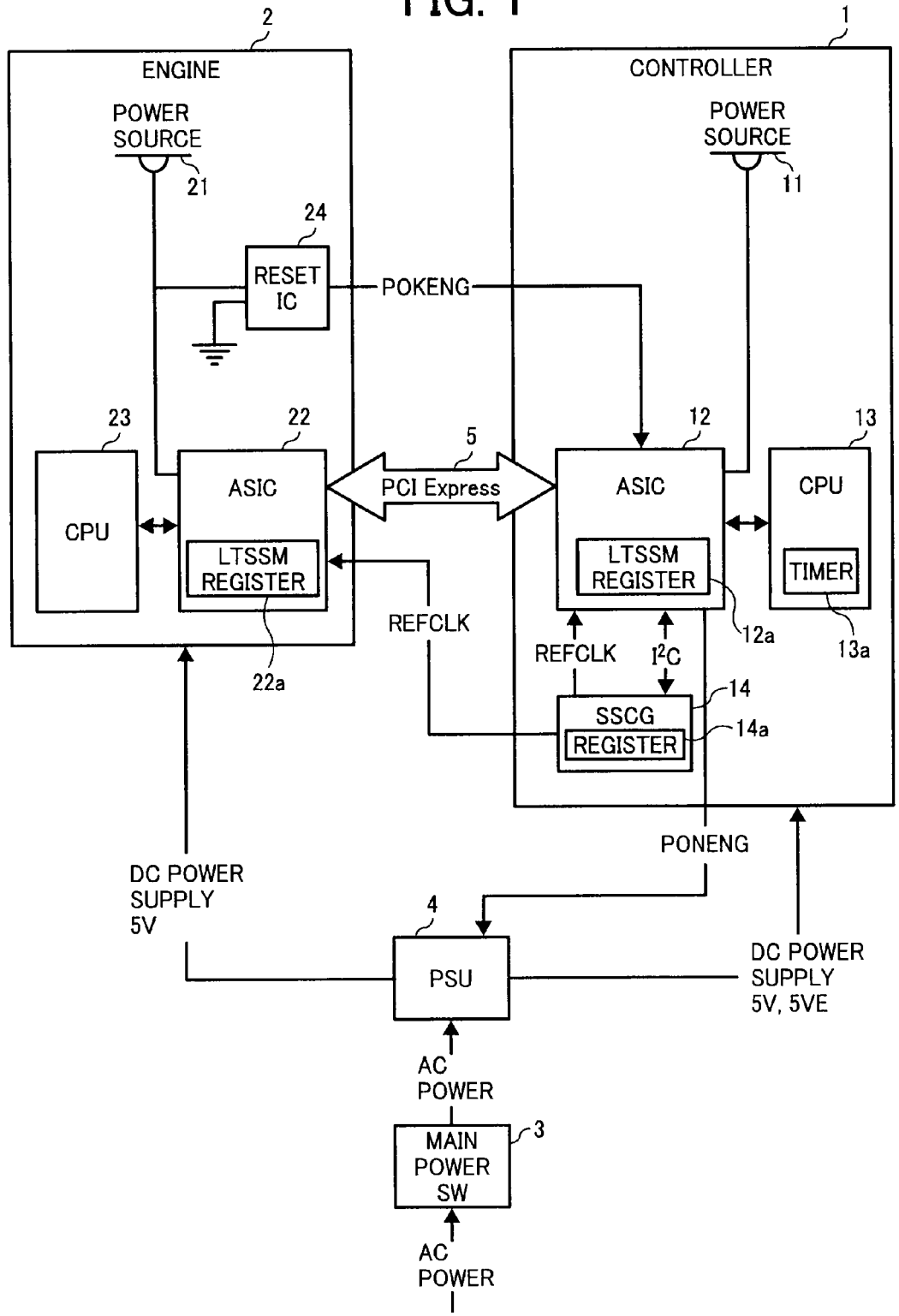
FIG. 1 is a block diagram for explaining an exemplary structure of an image processing apparatus according to a first embodiment of the present invention.

An image processing apparatus according to a first embodiment of the present invention has a structure shown in FIG. 1. The image processing apparatus includes an engine 2 that processes an image, for example, prints or scans an image, a controller 1 that controls operation of the engine 2, a main power switch (main power SW) 3, and a power supply unit (PSU) 4. The engine 2 includes a power source 21, and the controller 1 includes a power source 11. The PSU 4 supplies electric power to both the power source 11 and the power source 21. The controller 1 and the engine 2 are connected to each other via a bus 5 based on the PCI Express standards (hereinafter, "PCI Express 5"). The PCI Express 5 receives a power from the power source 21.

The engine 2 includes, apart from the power source 21, a reset integrated circuit (IC) 24, a central processing unit (CPU) 23, and an application specific integrated circuit (ASIC) 22. The controller 1 includes, apart from the power source 11, an ASIC 12, a CPU 13, and a spread-spectrum clock generator (SSCG) 14.

The SSCG 14 generates a reference clock (REFCLK) and transmits the REFCLK to the engine 2. The SSCG 14 includes a register 14a. The ASIC 12 includes a link training and status state machine (LTSSM) register 12a. The register 14a and the LTSSM register 12a are described later in details. The CPU 13 includes a timer 13a.

The main power SW 3 is ON at a first step of a boot-up process of the image processing apparatus. The PSU 4 then supplies power to both the controller 1 and the engine 2 thereby each of the controller 1 and the engine 2 generates a power required for its operation.

Specifically, when the main power SW 3 is ON in a state that alternating current (AC) power is OFF, a 5-VE direct current (DC) power source is ON. The power source 11 of the controller 1 is then ON so that the ASIC 12 asserts a power ON energy (PONENG) signal and transmits the PONENG to the PSU 4.

Upon receiving the PONENG from the ASIC 12, the PSU 4 supplies a S-V DC power to the engine 2 and a part of the controller 1. Thereafter, the reset IC 24 asserts a power OK engine (POKENG) signal indicative of a voltage output from the power source 21 of the engine 2 being within a predetermined operating-voltage range. When the ASIC 12 receives the POKENG, the ASIC 12 sends a REFCLK start command to the SSCG 14 via an I$^2$C bus. Upon receiving the REFCLK start command, the SSCG 14 starts transmitting the REFCLK to the engine 2.

Figure 2:
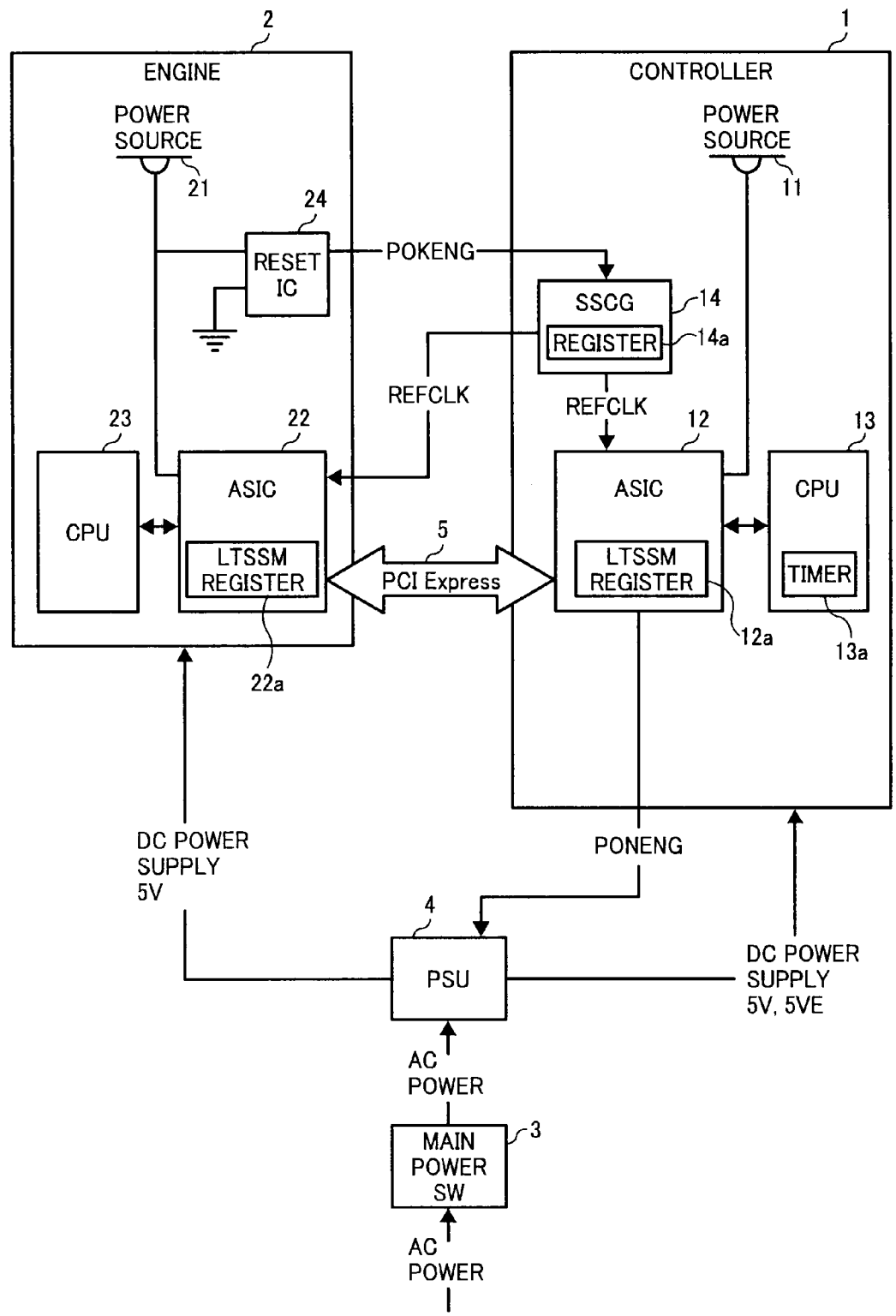
FIG. 2 a block diagram of for explaining another exemplary structure of the image processing apparatus according to the first embodiment.

In the image processing apparatus shown in FIG. 1, the SSCG 14 starts transmitting the REFCLK in response to the REFCLK start command from the ASIC 12. It is possible to configure an image processing apparatus in the manner shown in FIG. 2 in which the SSCG 14 starts transmitting the REFCLK without a process performed by the ASIC 12, i.e., by directly inputting the REFCLK to an output enable terminal of the SSCG 14. Specifically, as shown in FIG. 2, the POKENG that is asserted by the reset IC 24 causes the SSCG 14 able to output signals so that the SSCG 14 starts transmitting the REFCLK. The rest of the configuration of the image processing apparatus shown in FIG. 2 is the same or similar to the image processing apparatus shown in FIG. 1.

Thus, the image processing apparatus according to the first embodiment includes the PCI Express interface between the controller and the engine for transmitting a spread-spectrum reference clock. The image processing apparatus performs the reference-clock transmitting process as the boot-up process in which the controller starts transmitting the reference clock after a voltage output from the power source of the engine to the PCI Express interface is in the operating-voltage range. It means that the controller starts transmitting the reference clock after verifying that the voltage output from the power source of the device that receives the reference clock to the PCI Express I/O interface is in the operating-voltage range. This makes it possible to operate the receiver device without failures.

An image processing apparatus according to a second embodiment of the present invention stops transmitting the reference clock when the voltage output from the power source of the device, which receives the reference clock, to the PCI Express I/O interface decreases, due to some reasons, to a voltage lower than the lowest value within the operating-voltage range. This makes it possible to operate the receiver device without failures.

The image processing apparatus according to the second embodiment has the structure shown in FIG. 1 or 2, so that only an operational description is made below, not repeating the functional description. When the voltage at the power source 21 of the engine 2 decreases to a voltage lower than the lowest value within the operating-voltage range during the operation, if the image processing apparatus has the structure shown in FIG. 1, the ASIC 12 negates the POKENG and sends a REFCLK stop command to the SSCG 14 via the I$^2$C bus. If the image processing apparatus has the structure shown in FIG. 2, the enable terminal of the SSCG 14 is disabled so that the SSCG 14 stops transmitting the REFCLK.

In the image processing apparatus according to the second embodiment, when the voltage output from the power source of the engine to the PCI Express I/O interface is not in the operating-voltage range during the operation, the controller 1 stops transmitting the reference clock. It means that the image processing apparatus prevents the device that receives the reference clock from failure by stopping transmitting the reference clock when the voltage output from the power source of the receiver device to the PCI Express I/O interface decreases, by any reasons, to a voltage lower than the lowest value within the operating-voltage range.

The process is explained below when there is a failure in establishing communication based on the PCI Express in the boot-up process. When the ASIC 12 transmits the REFCLK start command, the timer 13a of the CPU 13 starts counting. When communication between the ASIC 12 and the ASIC 22 is established before the count of the timer 13a reaches a predetermined count, the image processing apparatus performs the next step of the boot-up process. When the count of the timer 13a reaches the predetermined count in the state that the communication between the ASIC 12 and the ASIC 22 is not established, the image processing apparatus takes another action that is explained below.

When an image processing apparatus according to a third embodiment of the present invention determines that there is a possibility that the PCI Express 5 is in an abnormal state, the image processing apparatus stops transmitting the reference clock to prevent the receiver device from failures.

Figure 3:
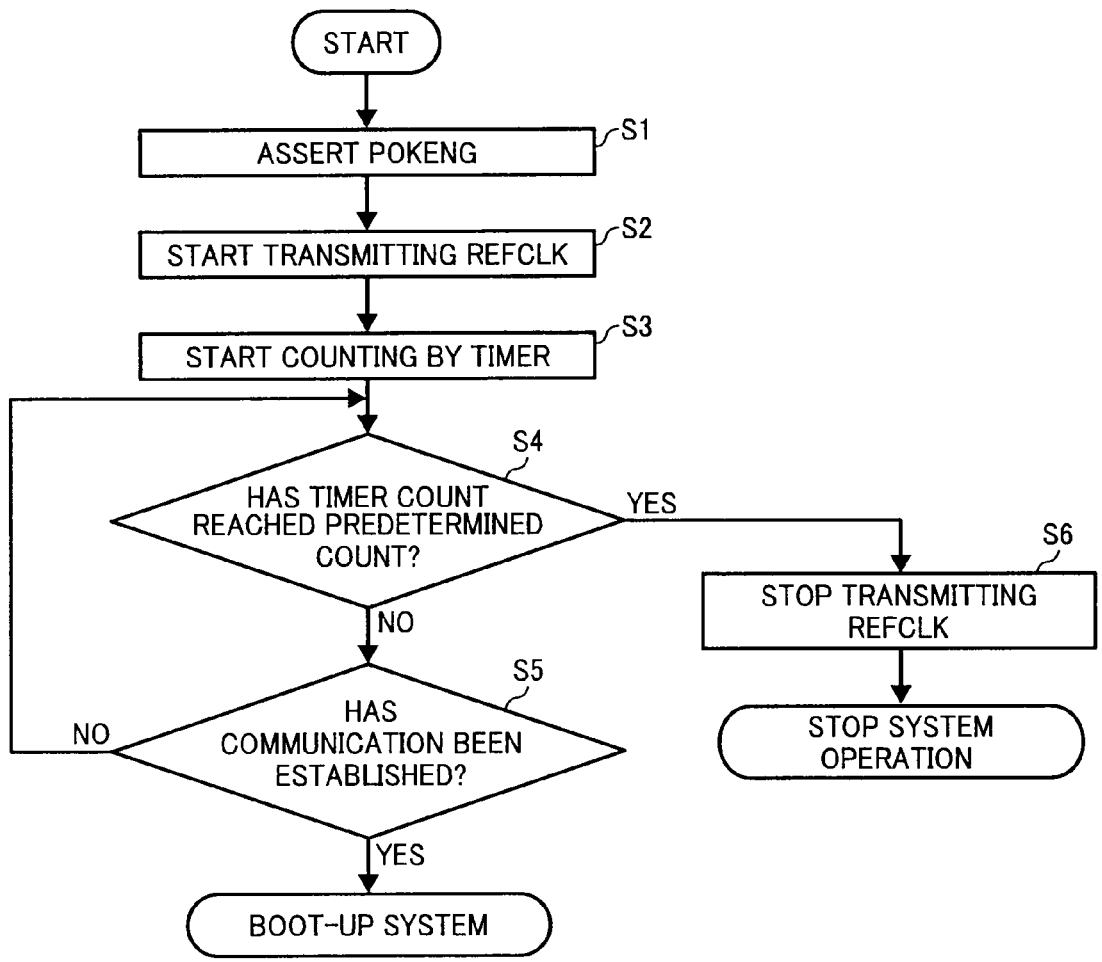
FIG. 3 is a flowchart of a process performed according to a third embodiment of the present invention.

The image processing apparatus according to the third embodiment has the same structure as shown in FIG. 1 and performs a process shown in FIG. 3. Operation of the image processing apparatus is described with reference to FIGS. 1 and 3.

First, the main power SW 3 is ON so that each of the controller 1 and the engine 2 generates power required for its operation. Then, the reset IC 24 asserts the POKENG, a signal indicative that the voltage output from the power source 21 to the PCI Express I/O interface is in the operating-voltage range (step S1). The ASIC 12 detects the POKENG, and sends the REFCLK start command to the SSCG 14 via the I$^2$C bus. Upon receiving the REFCLK start command, the SSCG 14 starts transmitting the REFCLK (step S2).

When the ASIC 12 sends the REFCLK start command, the timer 13a starts counting (step S3).

When communication between the ASIC 12 and the ASIC 22 is established (Yes at step S5) before a count of the timer 13a reaches a predetermined count (No at step S4), the process control goes to the next step of the boot-up process.

The CPU 13 determines whether the communication is established between the ASIC 12 and the ASIC 22 in the following manner. The LTSSM register 12a in the ASIC 12 is a 32-bit register and stores a status code in an area thereof from the header to 0 to 8 bits. The value of the status code differs depending on the status. When a link training between the ASIC 12 and the ASIC 22 succeeds, i.e., the communication between the ASIC 12 and the ASIC 22 is established, value "L0" (0x16) is stored in the LTSSM register 12a.

The CPU 13 refers to the LTSSM register 12a and checks whether the status code is L0. If the status code is L0, the CPU 13 determines that the communication between the ASIC 12 and the ASIC 22 is established. The above process of determining whether the communication between the ASIC 12 and the ASIC 22 is established is used in image processing apparatuses according later-described embodiments.

It is allowable that the ASIC 22 includes an LTSSM register 22a, and the CPU 13 first checks whether the status code of the LTSSM register 12a is L0 and then checks whether the status code of the LTSSM register 22a is L0. When such an arrangement is employed, it is possible to check both whether communication between the ASIC 12 and the ASIC 22 of the engine 2 is established and whether the status code of the LTSSM register 12a is L0.

When the count of the timer 13a reaches the predetermined count (Yes at step S4) in a state the communication between the ASIC 12 of the controller 1 and the ASIC 22 of the engine 2 is not established (No at step S5), it is determined that the communication fails to be established. After that, the ASIC 12 sends the REFCLK stop command to the SSCG 14 via the I²C bus (step S6) to stop the system operation.

When the communication is not established in a predetermined period after the first one of the reference clocks was transmitted, the image processing apparatus according to the third embodiment stops transmitting the reference clock. It means that if there is a possibility that the PCI Express interface is in an abnormal state, the image processing apparatus stops transmitting the reference clock to prevent the receiver device from failures.

When the communication is not established in a predetermined period after the first one of the spread-spectrum reference clocks was transmitted, an image processing apparatus according to a fourth embodiment of the present invention transmits another reference clock that is not a spread-spectrum clock (hereinafter, "non spread-spectrum reference clock") to establish the communication.

Figure 4:
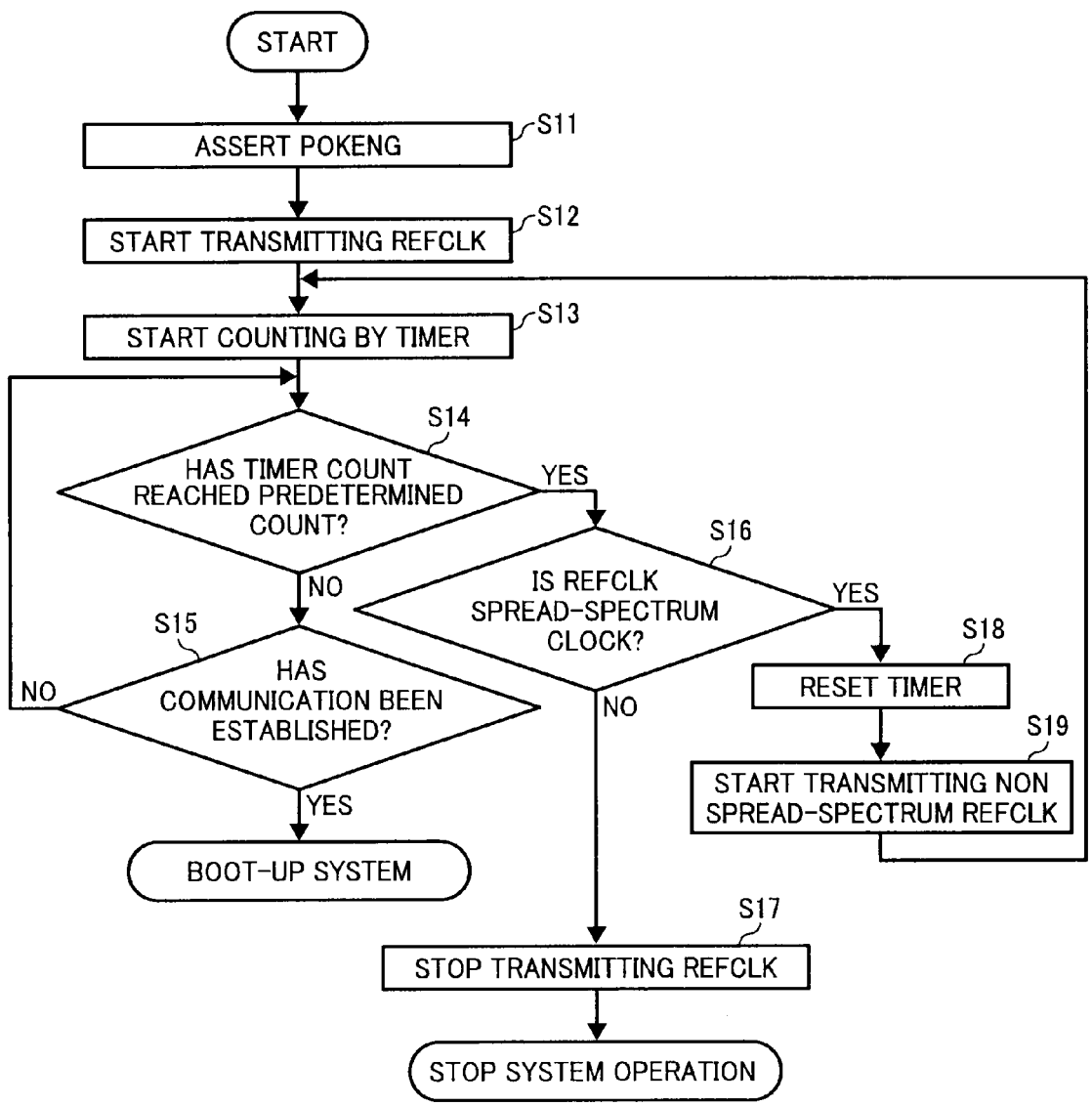
FIG. 4 is a flowchart of a process performed according a forth embodiment of the present invention.

The image processing apparatus according to the fourth embodiment has the same structure as shown in FIG. 1 and performs a process shown in FIG. 4. Operation of the image processing apparatus is described with reference to FIGS. 1 and 4.

First, the main power SW 3 is ON so that each of the controller 1 and the engine 2 generates power required for its operation. Then, the reset IC 24 asserts the POKENG (step S11). The ASIC 12 detects the POKENG, and sends the REFCLK start command to the SSCG 14 via the I²C bus. Upon receiving the REFCLK start command, the SSCG 14 starts transmitting the REFCLK (step S12).

When the ASIC 12 sends the REFCLK start command, the timer 13a of the CPU 13 starts counting (step S13).

When communication between the ASIC 12 and the ASIC 22 is established (Yes at step S15) before the count of the timer 13a reaches the predetermined count (No at step S14), the process control goes to a next step of the boot-up process.

When the count of the timer 13a reaches the predetermined count (Yes at step S14) in a state the communication between the ASIC 12 and the ASIC 22 is not established (No at step S15), it is determined whether the REFCLK is a spread-spectrum clock (step S16). When the REFCLK is not a spread-spectrum clock (No at step S16), the ASIC 12 sends the REFCLK stop command to the SSCG 14 via the I²C bus (step S17) to stop the system operation.

The SSCG 14 determines whether the REFCLK is a spread-spectrum clock in the following manner. Bits 4 and 5 of the register 14a of the SSCG 14 are used for spreading a frequency of the REFCLK, where Bit N represents N-th bit from the head. More particularly, a value indicative of any one of −0.5%, −0.25%, −0.1%, and OFF can be stored in Bits 4 and 5 as a spreading factor. For example, when both Bits 4 and 5 are OFF, frequency spreading is not performed. When Bit 4 or 5 stores therein values indicative of the spreading factor, the frequency of the REFCLK is spread based on the spreading factor. The SSCG 14 refers to a value stored in Bits 4 and 5 of the register 14a to determine whether the REFCLK is a spread-spectrum clock.

When the REFCLK is a spread-spectrum clock (Yes at step S16), the timer 13a is reset (step S18) and the ASIC 12 sends a command for transmitting a non spread-spectrum reference clock to the SSCG 14 via the I²C bus. Upon receiving the command, the SSCG 14 transmits the non spread-spectrum reference clock (step S19) to establish the communication.

The SSCG 14 stores a value indicative of OFF in Bits 4 and 5, and generates the non spread-spectrum reference clock at step S19.

When the communication is not established in the predetermined period after the first one of the spread-spectrum reference clocks was transmitted, the image processing apparatus according to the fourth embodiment transmits a non spread-spectrum reference clock to establish the communication. Even when the communication is not established by using the spread-spectrum reference clock in the predetermined period after the first one of the spread-spectrum reference clocks was transmitted, it is possible to establish the communication by using the non spread-spectrum reference clock.

When the communication is not established in the predetermined period after the first one of the spread-spectrum reference clocks was transmitted in the boot-up process, an image processing apparatus according to a fifth embodiment of the present invention transmits another spread-spectrum reference clock that is produced by decreasing the spreading factor of the transmitted spread-spectrum reference clock (hereinafter, "narrower spread-spectrum reference clock") to establish the communication.

Figure 5:
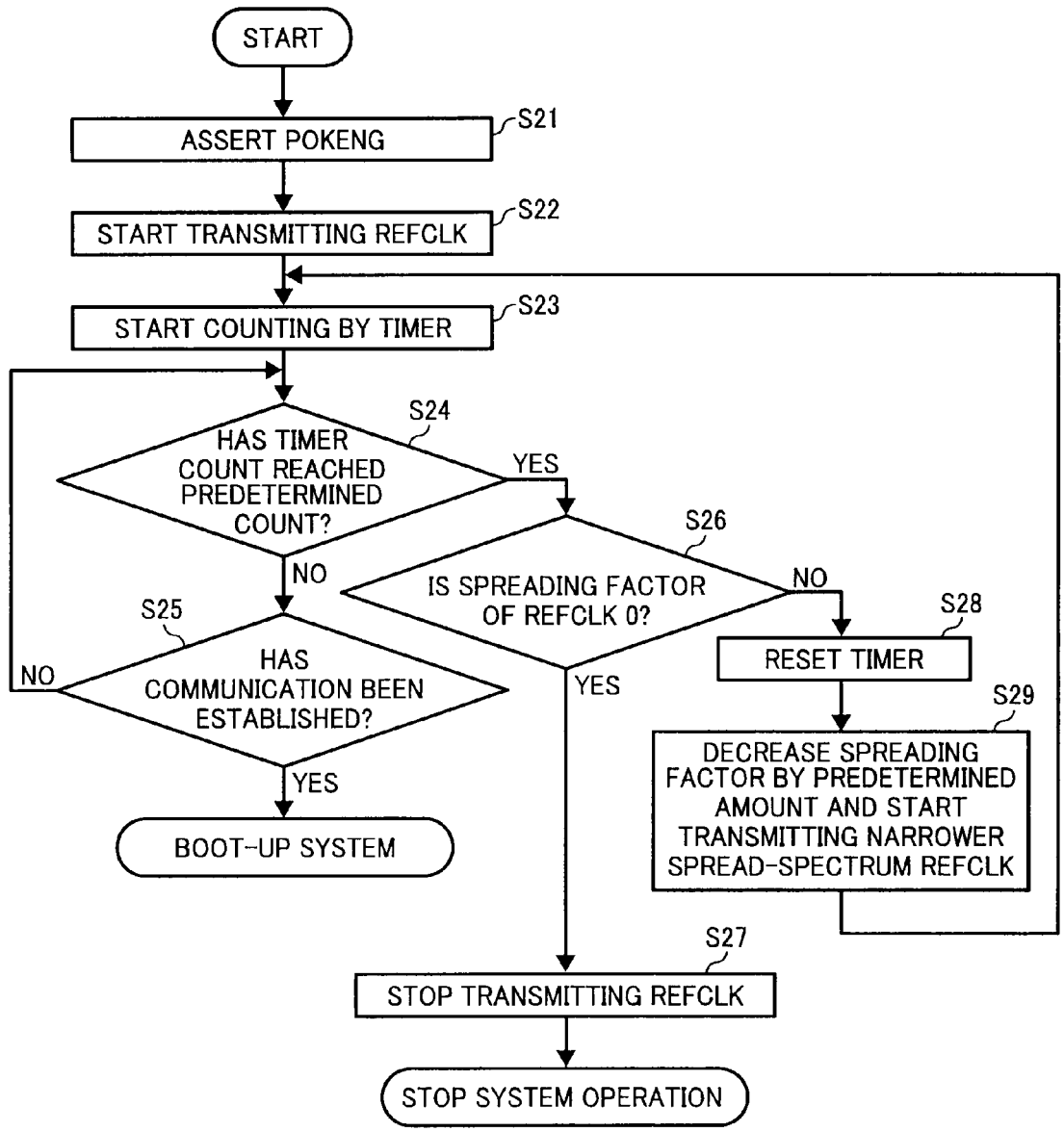
FIG. 5 is a flowchart of a process performed according to a fifth embodiment of the present invention.

The image processing apparatus according to the fifth embodiment has the same structure as shown in FIG. 1 and performs a process shown in FIG. 5. Operation of the image processing apparatus is described with reference to FIGS. 1 and 5.

First, the main power SW 3 is ON so that each of the controller 1 and the engine 2 generates power required for its operation. Then, the reset IC 24 asserts the POKENG (step S21). The ASIC 12 detects the POKENG, and sends the REFCLK start command to the SSCG 14 via the I²C bus. Upon receiving the REFCLK start command, the SSCG 14 starts transmitting the REFCLK (step S22).

When the ASIC 12 sends the REFCLK start command, the timer 13a of the CPU 13 starts counting (step S23).

When communication between the ASIC 12 and the ASIC 22 is established (Yes at step S25) before a count of the timer 13a reaches a predetermined count (No at step S24), the process control goes to a next step of the boot-up process.

When the count of the timer 13a reaches the predetermined count (Yes at step S24) in a state that the communication between the ASIC 12 and the ASIC 22 is not established (No at step S25), it is determined whether the spreading factor of the REFCLK is 0 (step S26). When the spreading factor is 0 (Yes at step S26), the ASIC 12 sends the REFCLK stop command to the SSCG 14 via the I$^2$C bus. Upon receiving the REFCLK stop command, The SSCG 14 stops transmitting the REFCLK (step S27) to stop the system operation.

The SSCG 14 determines whether the spreading factor of the REFCLK is 0 by referring to the register 14a. When values stored in Bits 4 and 5 indicate OFF, the SSCG 14 determines that the spreading factor of the REFCLK is 0.

When the spreading factor of the REFCLK is not 0 (No at step S26), the timer 13a is reset (step S28) and the ASIC 12 sends a command for transmitting the narrower spread-spectrum REFCLK to the SSCG 14 via the I$^2$C bus. Upon receiving the command, the SSCG 14 transmits the narrower spread-spectrum REFCLK by decreasing the spreading factor by the predetermined amount (step S29) to establish the communication based on the PCI Express between the ASIC 12 and the ASIC 22.

The SSCG 14 stores a value that indicates a spreading factor lower than that of the latest-transmitted reference clock by the predetermined amount in Bits 4 and 5 of the register 14a, and generates the narrower spread-spectrum reference clock having the lower spreading factor at step S29. Image processing apparatuses according to later-described embodiments of the present invention uses the above-described spreading-factor reducing process.

After that, when the count of the timer 13a reaches the predetermined count in the state the communication is not established, the ASIC 12 sends the command for transmitting a narrower spread-spectrum REFCLK to the SSCG 14 via the I$^2$C bus. Upon receiving the command, the SSCG 14 transmits the narrower spread-spectrum REFCLK by decreasing the spreading factor by a predetermined amount. The spreading-factor reducing process is repeated until the communication between the ASIC 12 and the ASIC 22 is established.

When the communication is not established in the predetermined period after the first one of the reference clocks having a certain spreading factor was transmitted in the boot-up process, the image processing apparatus according to the fifth embodiment decreases the spreading factor of the transmitted reference clock to a value low enough to establish the communication. As a result, even when the communication is not established by using a first spread-spectrum reference clock in the predetermined period after the first one of the first spread-spectrum reference clocks was transmitted in the boot-up process, it is possible to establish the communication by using a second reference clock having a spreading factor lower than that of the first spread-spectrum reference clock.

Explained below is a method of increasing the spreading factor of the reference clock for the PCI Express as much as possible. The more the spreading factor increases, the more electromagnetic interference (EMI) decreases. When the spreading factor of the reference clock is too large, some conventional devices including an interface based on the PCI Express standards cannot establish communication. On the other hand, a small spreading factor causes the EMI to increase, which causes another problem. An image processing apparatus according to a sixth embodiment of the present invention performs a process as the boot-up process that increases the spreading factor of the reference clock as much as possible to reduce the EMI.

Figure 6A:
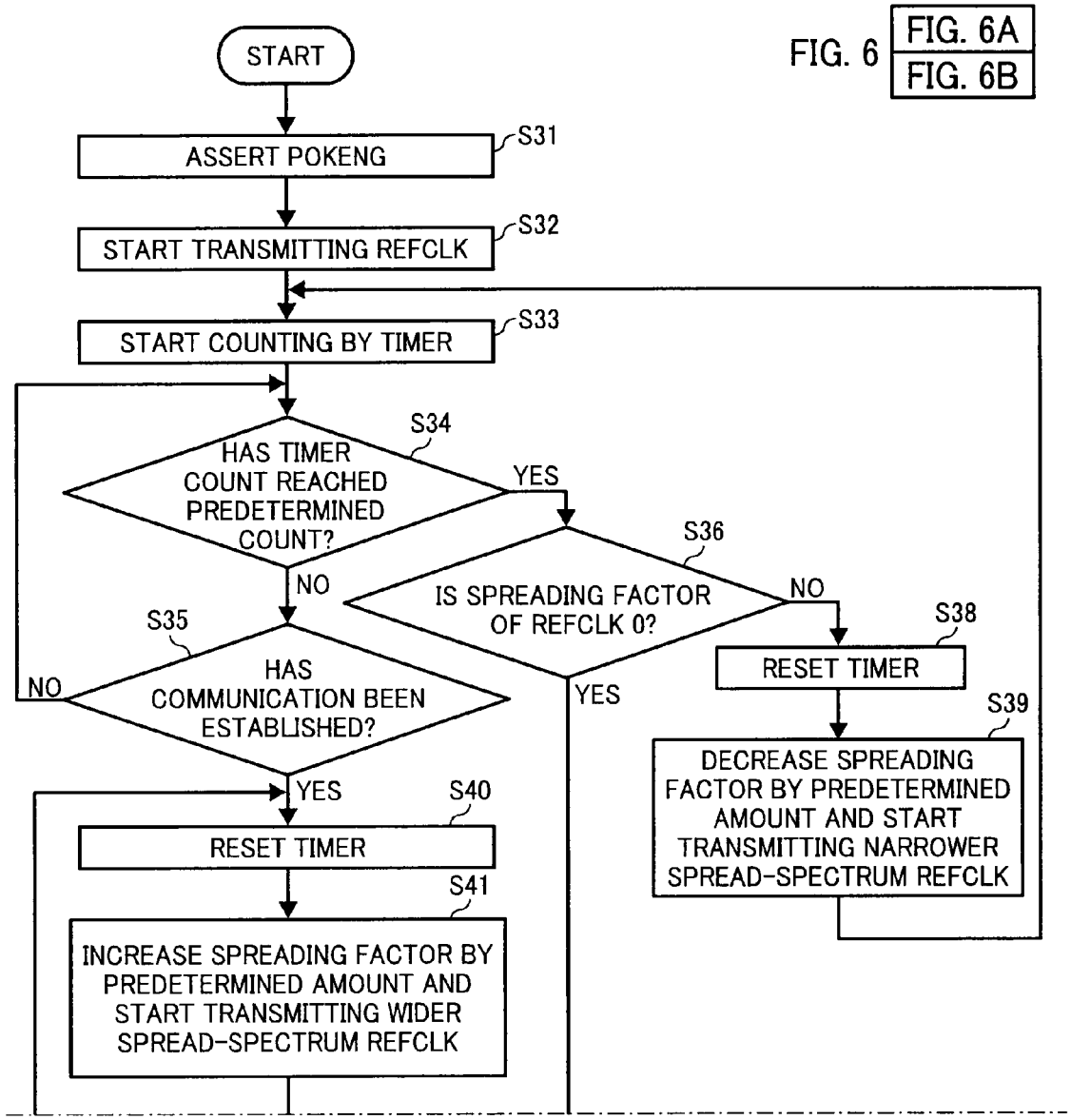
FIG. 6 is a flowchart of a process performed according to a sixth embodiment of the present invention.
Figure 6B:
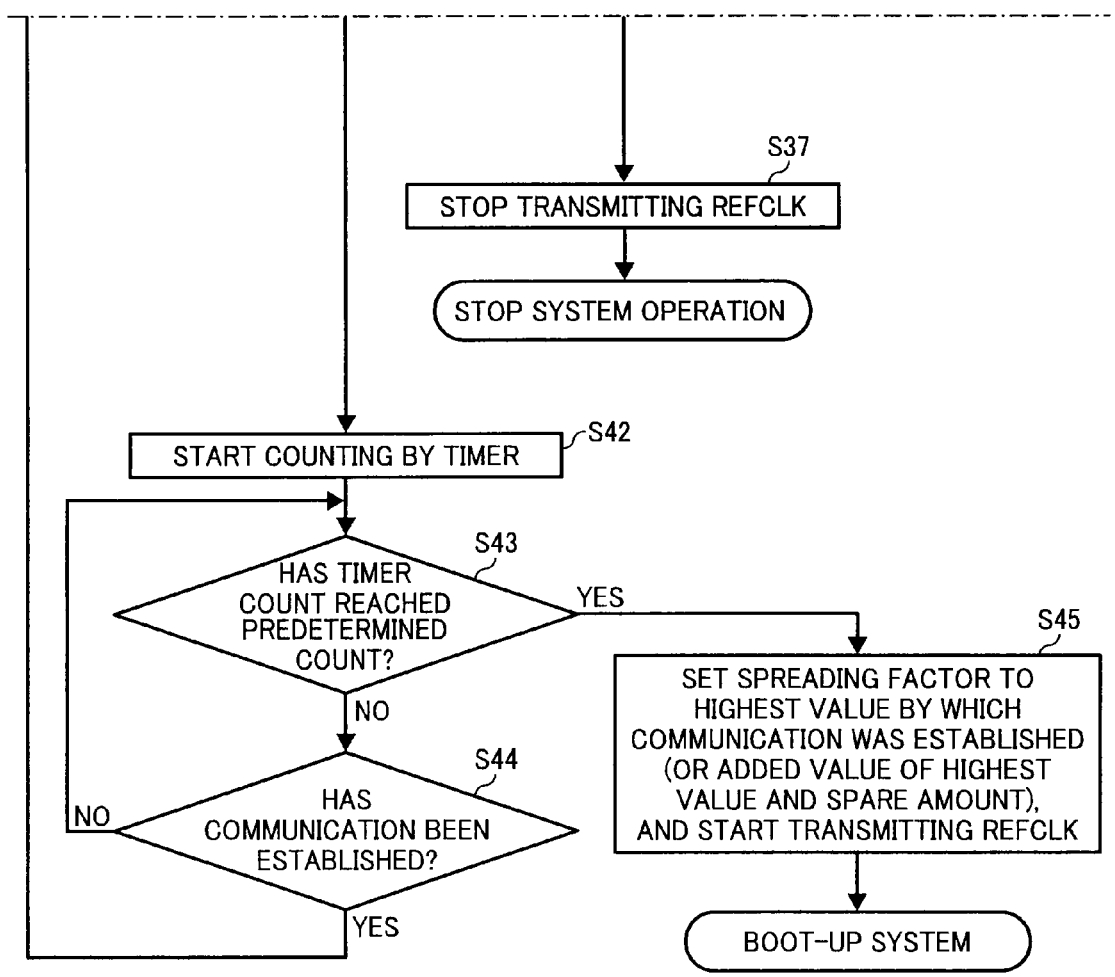

The image processing apparatus according to the sixth embodiment has the same structure as shown in FIG. 1 and performs a process shown in FIG. 6. Operation of the image processing apparatus is described with reference to FIGS. 1 and 6.

First, the main power SW 3 is ON so that each of the controller 1 and the engine 2 generates power required for its operation. Then, the reset IC 24 asserts the POKENG (step S31). The ASIC 12 detects the POKENG, and sends the REFCLK start command to the SSCG 14 via the I$^2$C bus. Upon receiving the REFCLK start command, the SSCG 14 starts transmitting the REFCLK (step S32).

When the ASIC 12 sends the REFCLK start command, the timer 13a of the CPU 13 starts counting (step S33).

When communication between the ASIC 12 and the ASIC 22 is established (Yes at step S35) before a count of the timer 13a reaches a predetermined count (No at step S34), the process control goes to step S40.

When the count of the timer 13a reaches the predetermined count (Yes at step S34) in a state that the communication between the ASIC 12 and the ASIC 22 is not established (No at step S35), it is determined whether the spreading factor of the REFCLK is 0 (step S36). When the spreading factor is 0 (Yes at step S36), the ASIC 12 sends the REFCLK stop command to the SSCG 14 via the I$^2$C bus. Upon receiving the REFCLK stop command, the SSCG 14 stops transmitting the REFCLK (step S37) to stop the system operation.

When the spreading factor of the REFCLK is not 0 (No at step S36), the timer 13a is reset (step S38) and the ASIC 12 sends a command for transmitting a narrower spread-spectrum REFCLK to the SSCG 14 via the I$^2$C bus. Upon receiving the command, the SSCG 14 transmits the narrower spread-spectrum REFCLK by decreasing the spreading factor by the predetermined amount (step S39) to establish the communication based on the PCI Express between the ASIC 12 and the ASIC 22.

When the communication between the ASIC 12 and the ASIC 22 is established at step S35 (Yes at step S35), the timer 13a is reset (step S40), and the ASIC 12 sends to the SSCG 14 via the I$^2$C bus a command for transmitting another spread-spectrum reference clock that has a spreading factor higher than the transmitted spread-spectrum reference clock (hereinafter, "wider spread-spectrum reference clock"). Upon receiving the command, the SSCG 14 transmits the wider spread-spectrum reference clock by increasing the spreading factor by a predetermined amount (step S41) to establish the communication. The spreading-factor raising process is repeated until a specific wider spread-spectrum reference clock is found by which the communication was not established in the predetermined period after the first one of the specific wider spread-spectrum reference clocks was transmitted.

The SSCG 14 stores a value that indicates a spreading factor higher than that of the latest-transmitted reference clock by the predetermined amount in Bits 4 and 5 of the register 14a, and generates the wider spread-spectrum reference clock having the higher spreading factor at step S41.

After that, the timer 13a starts counting again (step S42). When communication between the ASIC 12 and the ASIC 22 is established (Yes at step S44) before a count of the timer 13a reaches a predetermined count (No at step S43), the process control returns to step S40.

When the count of the timer 13a reaches the predetermined count (Yes at step S43) in a state that the communication between the ASIC 12 and the ASIC 22 is not established (No at step S44), the SSCG 14 sets the spreading factor to a final value that is either a highest one of values by which the communication was established at step S44 or an added value of the highest value and a predetermined extra amount, and transmits a reference clock having the final value as the spreading factor (step S45) to boot-up the system.

Every time the communication is established, the SSCG 14 updates the spreading factor that is stored in Bits 4 and 5 of the register 14a and stores a log of the spreading factor in a storage unit such as a memory. The SSCG 14 sets the spreading factor to the final value that is either a highest one of values by which the communication was established at step S44 or an added value of the highest value and a predetermined extra amount, and generates a reference clock having the final value as the spreading factor at step S45.

The image processing apparatus according to the sixth embodiment first establishes the communication by transmitting the reference clock, and then increases the spreading factor of the reference clock to a highest one of values capable of establishing the communication. This makes it possible to decrease the EMI by increasing the spreading factor of the reference clock as much as possible in the boot-up process.

Each of the image processing apparatuses according to the first to the sixth embodiments performs the above operation as the boot-up process for transmitting the reference clock after the voltage at the power source of the engine 2 is in the operating-voltage range. An image processing apparatus according to a seventh embodiment of the present invention performs such operation, i.e., reference-clock transmitting processes, as processes of rebooting from an energy-saving mode.

The energy-saving mode is a mode in which the 5-VE DC power is ON while the 5-V DC power is OFF, so that the controller 1, which receives both the 5-VE and the 5-V power in a normal mode, receives only the 5-VE DC power and the engine 2, which receives the 5-V power in the normal mode, receives no power.

The image processing apparatus according to the seventh embodiment has the same structure as shown in FIG. 1.

First, a process of shifting to the energy-saving mode is explained. FIG. 7 is a flowchart of the process of shifting from the normal mode to the energy-saving mode. The image processing apparatus is in a stand-by mode at the beginning of the process (step S51). When the ASIC 12 negates the PONENG (step S52), the PSU 4 switches the 5-V DC power OFF (step S53) so that the power source 21 of the engine 2 is OFF (step S54). Thereafter, the reset IC 24 negates the POKENG (step S55). In response to the POKENG negation, the ASIC 12 sends a REFCLK stop command to the SSCG 14 via the I²C bus, and the SSCG 14 stop transmitting the reference clock (step S56). At the end of the process, the image processing apparatus is in the energy-saving mode (step S57).

Then, a process of rebooting from the energy-saving mode is explained. FIG. 8 is a flowchart of the process of rebooting from the energy-saving mode.

The image processing apparatus is in the energy-saving mode at the beginning of the process (step S61). When the ASIC 12 asserts the PONENG (step S62), the PSU 4 switches the 5-V DC power ON (step S63) so that the power source 21 of the engine 2 is ON (step S64) and the reset IC 24 asserts the POKENG (step S65). Succeeding steps after step S65 for transmitting the reference clock are similar to those shown in FIGS. 3 to 8. It means that, in the process of rebooting from the energy-saving mode, it is determined whether a voltage output from the power source 21 of the engine 2 to the PCI Express I/O interface is in the operating-voltage range, and when the voltage is in the operating-voltage range the SSCG 14 starts transmitting the reference clock.

The image processing apparatus according to the seventh embodiment performs the reference-clock transmitting process as the reboot process for transmitting the reference clock after verifying that the voltage output from the power source of the engine to the interface is in the operating-voltage range. This makes it possible to operate the engine without failures.

An embodiment of the present invention can be used as a technique for a device that includes an interface based on the PCI Express standards.

According to an aspect of the present invention, in the image processing apparatus, the controller starts transmitting a reference clock only when a voltage output from a power source of the engine that receives the reference clock via the interface is in a predetermined operating-voltage range. This makes it possible to operate the engine 2 without failures.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An image processing apparatus comprising:
   an engine unit that processes an image;
   a control unit that controls operation of the engine unit;
   an interface that connects the engine unit and the control unit to each other, wherein the control unit controls operation of the engine unit by sending a reference clock to the engine unit via the interface; and
   a power source that supplies electric power to the interface, wherein
   the engine unit includes a first determining unit that determines whether a voltage output from the power source to the interface is in a predetermined operating-voltage range, and
   the control unit includes a clock generator that starts generating, when the first determining unit determines that the voltage is in the operating-voltage range, a first reference-clock and transmits the first reference-clock to the engine unit via the interface.

2. The image processing apparatus according to claim 1, wherein, when the first determining unit determines that the voltage is not in the operating-voltage range, the clock generator stops transmitting the first reference-clock.

3. The image processing apparatus according to claim 1, wherein
   the control unit further includes a second determining unit that determines whether a communication is established between the control unit and the engine unit in a predetermined period after the clock generator starts transmitting the first reference-clock, and
   when the second determining unit determines that the communication is not established in the predetermined period after the clock generator starts transmitting the first reference-clock, the clock generator stops transmitting the first reference-clock.

4. The image processing apparatus according to claim 1, wherein
   the control unit further includes a second determining unit that determines whether a communication is established between the control unit and the engine unit in a predetermined period after the clock generator starts transmitting the first reference-clock, and
   when the second determining unit determines that the communication is not established in the predetermined period after the clock generator starts transmitting the first reference-clock, the clock generator generates a second reference-clock that is not a spread-spectrum clock.

5. The image processing apparatus according to claim 1, wherein the control unit further includes a second determining unit that determines whether a communication is established between the control unit and the engine unit in a predetermined period after the clock generator starts transmitting the first reference-clock, and when the second determining unit determines that the communication is not established in the predetermined period after the clock generator starts transmitting the first reference-clock, the clock generator generates a second reference-clock that is produced by decreasing a spreading factor of the first reference-clock to a value by which it is possible to establish the communication.

6. The image processing apparatus according to claim 1, wherein the control unit further includes a second determining unit that determines whether a communication is established between the control unit and the engine unit in a predetermined period after the clock generator starts transmitting the first reference-clock, and after the second determining unit determines that the communication is established in the predetermined period after the clock generator starts transmitting the first reference-clock, the clock generator generates a second reference-clock that is produced by increasing a spreading factor of the first reference-clock to a highest value by which it is possible to establish the communication.

7. The image processing apparatus according to claim 1, wherein the clock generator starts transmitting the first reference-clock as a process of booting up the image processing apparatus.

8. The image processing apparatus according to claim 1, wherein the clock generator starts transmitting the first reference-clock as a process of rebooting the image processing apparatus from an energy-saving mode in which the engine unit does not receive electric power and the control unit receives a part of electric power.

9. The image processing apparatus according to claim 1, the interface is based on peripheral component interconnect express standards.

10. A method of transmitting a reference clock from a first device to a second device via an interface, the method comprising:

determining whether a voltage input to the interface is in a predetermined operating-voltage range; and starting generating, when it is determined at the determining that the voltage is in the operating-voltage range, a reference clock by the first device and transmitting the reference clock to the second device via the interface.

11. The method according to claim 10, wherein the first device is an engine unit that processes an image, the second device is a control unit that controls operation of the engine unit, and the interface is based on peripheral component interconnect express standards.

* * * * *